(12) United States Patent
Kim

(10) Patent No.: US 7,728,790 B2
(45) Date of Patent: Jun. 1, 2010

(54) PLASMA DISPLAY DEVICE

(75) Inventor: Ki-Jung Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 701 days.

(21) Appl. No.: 11/168,927

(22) Filed: Jun. 29, 2005

(65) Prior Publication Data

US 2006/0012043 A1 Jan. 19, 2006

(30) Foreign Application Priority Data

Jun. 30, 2004 (KR) .................. 10-2004-0050455

(51) Int. Cl.
G09G 3/28 (2006.01)
(52) U.S. Cl. .................. 345/60; 361/720; 345/206
(58) Field of Classification Search ............ 345/60–68, 345/205, 206; 313/484–493; 315/169.4; 438/106–108; 361/688, 704, 709, 720
See application file for complete search history.

(56) References Cited

U.S. PATENT DOCUMENTS

| 5,737,191 | A | * | 4/1998 | Horiuchi et al. |
| 6,292,369 | B1 | * | 9/2001 | Daves et al. |
| 6,847,415 | B1 | * | 1/2005 | Yoshimura et al. |
| 2001/0008776 | A1 | * | 7/2001 | Lai et al. |
| 2003/0141576 | A1 | * | 7/2003 | Kawada et al. |
| 2005/0095746 | A1 | * | 5/2005 | Aoyagi |

FOREIGN PATENT DOCUMENTS

JP 08102583 * 4/1996

* cited by examiner

*Primary Examiner*—Regina Liang
(74) *Attorney, Agent, or Firm*—H.C. Park & Associates, PLC

(57) ABSTRACT

A plasma display device including a plasma display panel that displays images, an integrated circuit chip that controls potentials to be applied to a discharge electrode, a protection film that covers the integrated circuit chip, a thermally conductive material disposed on a portion of a surface of the protection film, and a cover plate that covers the integrated circuit chip.

18 Claims, 4 Drawing Sheets

PLASMA DISPLAY DEVICE

CROSS REFERENCE TO RELATED APPLICATION

This application claims priority to and the benefit of Korean Patent Application No. 10-2004-0050455, filed on Jun. 30, 2004, which is hereby incorporated by reference for all purposes as if fully set forth herein.

BACKGROUND OF THE INVENTION

1. Field of the Invention

The present invention relates to a plasma display device, and more particularly, to a plasma display device that may efficiently radiate heat generated from an integrated circuit chip and that may prevent the integrated circuit chip from breaking when manufacturing the plasma display device.

2. Discussion of the Background

Generally, plasma display panels (PDP) display images by exciting a fluorescent material using ultra violet rays generated from a gas discharge. Since they may be thin and have a large screen, they are considered as a next generation display to replace the cathode ray tube.

Conventional PDPs may be alternating current (AC) PDPs, direct current (DC) PDPs, or a hybrid according to their structure and principle of operation. Particularly, AC PDPs and DC PDPs can be divided into facing discharge PDPs and surface discharge PDPs according to the discharging structure. Recently, surface discharge AC PDPs are being widely used.

Since the plasma display device displays images by generating discharges in the PDP corresponding to externally applied image signals, potentials corresponding to the image signals are applied to a discharge electrode included in the PDP. For this purpose, the plasma display device includes an integrated circuit chip, which is operated at a high voltage. Hence, the integrated circuit chip is relatively expensive.

The integrated circuit chip generates a lot of heat since it processes high-voltage signals at a high speed. Heat generated by the integrated circuit chip is particularly a serious problem in a high resolution PDP. Accordingly, heat radiation in a high resolution PDP is an important consideration when developing the high resolution PDP.

Typically, in order to radiate heat generated from an integrated circuit chip, a cover plate formed of a material having thermal conductivity is installed contacting the integrated circuit chip, or a heat radiation sheet is installed contacting the integrated circuit chip by interposing the heat radiation sheet between the cover plate and the integrated circuit chip. The heat radiation surface may be increased by coating a thermally conductive grease on a surface of the integrated circuit chip.

However, excessive force may be applied to a portion of a surface of the integrated circuit chip when installing the heat radiation sheet or the cover plate. Therefore, if excessive force is applied to the integrated circuit chip, it is very likely that the expensive integrated circuit chip will break.

Also, the heat radiation efficiency may be reduced if the thermally conductive grease, which is coated on a surface of the integrated circuit chip, does not strongly adhere to the surface of the integrated circuit chip. The reduction of heat radiation efficiency can cause the integrated circuit chip to malfunction, thereby distorting the PDP's images or degrading the quality of the PDP by reducing the lifespan of the integrated circuit chip.

SUMMARY OF THE INVENTION

The present invention provides a plasma display device that may efficiently radiate heat generated from an integrated circuit chip and that may prevent the integrated circuit chip from breaking while manufacturing the plasma display device Additional features of the invention will be set forth in the description which follows, and in part will be apparent from the description, or may be learned by practice of the invention.

The present invention discloses a plasma display device including a plasma display panel that displays images, an integrated circuit chip that controls a potential to be applied to a discharge electrode of the plasma display panel, a protection film that covers the integrated circuit chip, a thermally conductive material disposed on at least a portion of a surface of the protection film, and a cover plate that covers the integrated circuit chip.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

The present invention will now be described more fully with reference to the accompanying drawings showing exemplary embodiments of the invention.

Figure 1:
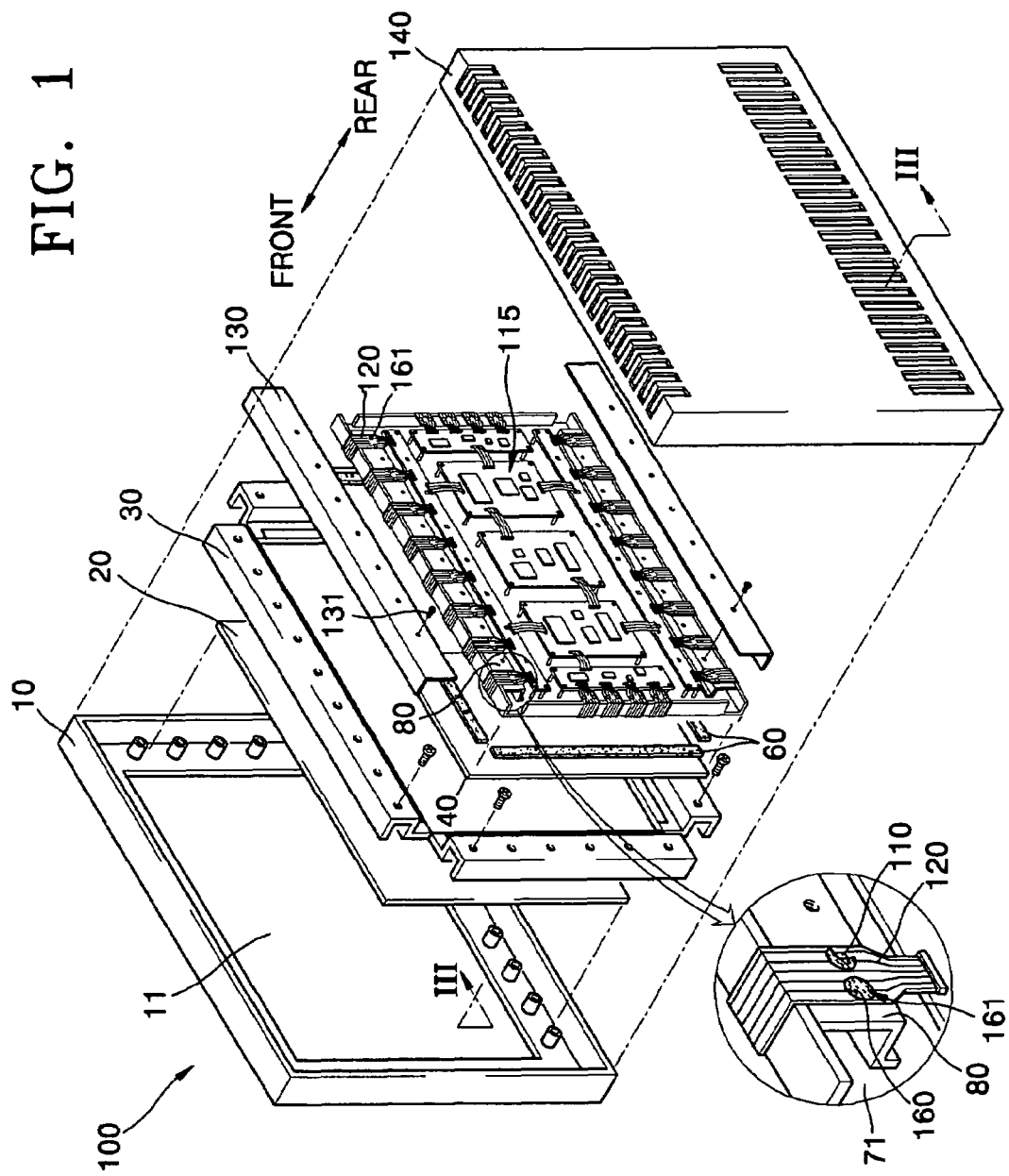
FIG. 1 is an exploded perspective view showing a plasma display device according to a first embodiment of the present invention.

A plasma display device according to a first exemplary embodiment of the present invention will now be described with reference to FIGS. 1, 2, 3 and 4. Referring to FIG. 1, the plasma display device 100 includes a front cabinet 10 in which a window 11 is formed, an electromagnetic shielding filter 20 disposed on a rear of the front cabinet 10 and covering the window 11, a filter holder 30 that couples the electromagnetic shielding filter 20 with the front cabinet 10, a PDP 40 disposed on a rear of the filter holder 30, a chassis 71 that supports the PDP 40, a reinforcing member 80 that reinforces the chassis 71 and prevents deformation of the chassis 71, and a circuit unit 115 that drives the PDP 40 and is disposed on a rear of the chassis 71.

The electromagnetic shielding filter 20 may be directly attached to the PDP 40, and in this case, the filter holder 30 may not be necessary.

The chassis 71 not only prevents bending and deformation of the PDP 40 due to the PDP's thermal load and weight, but it also radiates generated heat from the PDP 40 since it is formed of a thermally conductive material, such as aluminum (Al).

Additionally, the chassis 71 provides a space for mounting devices of the circuit unit 115, and it helps to radiate heat generated from the devices of the circuit unit 115.

The reinforcing member 80, which reinforces the strength of the chassis 71, may be included in the plasma display device 100. In this case, if the reinforcing member 80 is disposed on a rear of the chassis 71, a portion of the devices of the circuit unit 115 may be disposed on a rear of the reinforcing member 80. The reinforcing member 80 may be formed of a material such as Al so that it may radiate heat.

The plasma display device 100 also includes connecting cables 120 that electrically connect the circuit unit 115 to the PDP 40, integrated circuit chips 110 that may be mounted on the connecting cables 120, and a protection film 160 that covers the integrated circuit chips 110. The protection film 160 may include a protrusion-recess unit 161.

The plasma display device 100 further includes a cover plate 130 that radiates heat generated from the integrated circuit chips 110 by covering the integrated circuit chips 110 and the connecting cables 120, and a rear cabinet 140 that is coupled to the front cabinet 10 and is disposed behind the circuit unit 115 and the cover plate 130.

The PDP 40 may be coupled to the front of the chassis 71 with dual sided tape 60, and a heat radiation sheet 56 may be interposed between the PDP 40 and the chassis 71.

The connecting cables 120 electrically connect the PDP 40 and the integrated circuit chips 110. More specifically, a plurality of wires included in the connecting cables 120 may electrically connect the discharge electrodes 45 of the PDP 40 and the integrated circuit chips 110. Here, the discharge electrodes 45 may be sustaining electrode pairs 44 or they may be address electrodes 53, which will be described below.

The connecting cables 120 may be a tape carrier package (TCP). The wires of the connecting cables 120 extend in a length direction of the connecting cables 120, and they electrically connect the circuit unit 115 to the integrated circuit chips 110 and the PDP 40.

Figure 2:
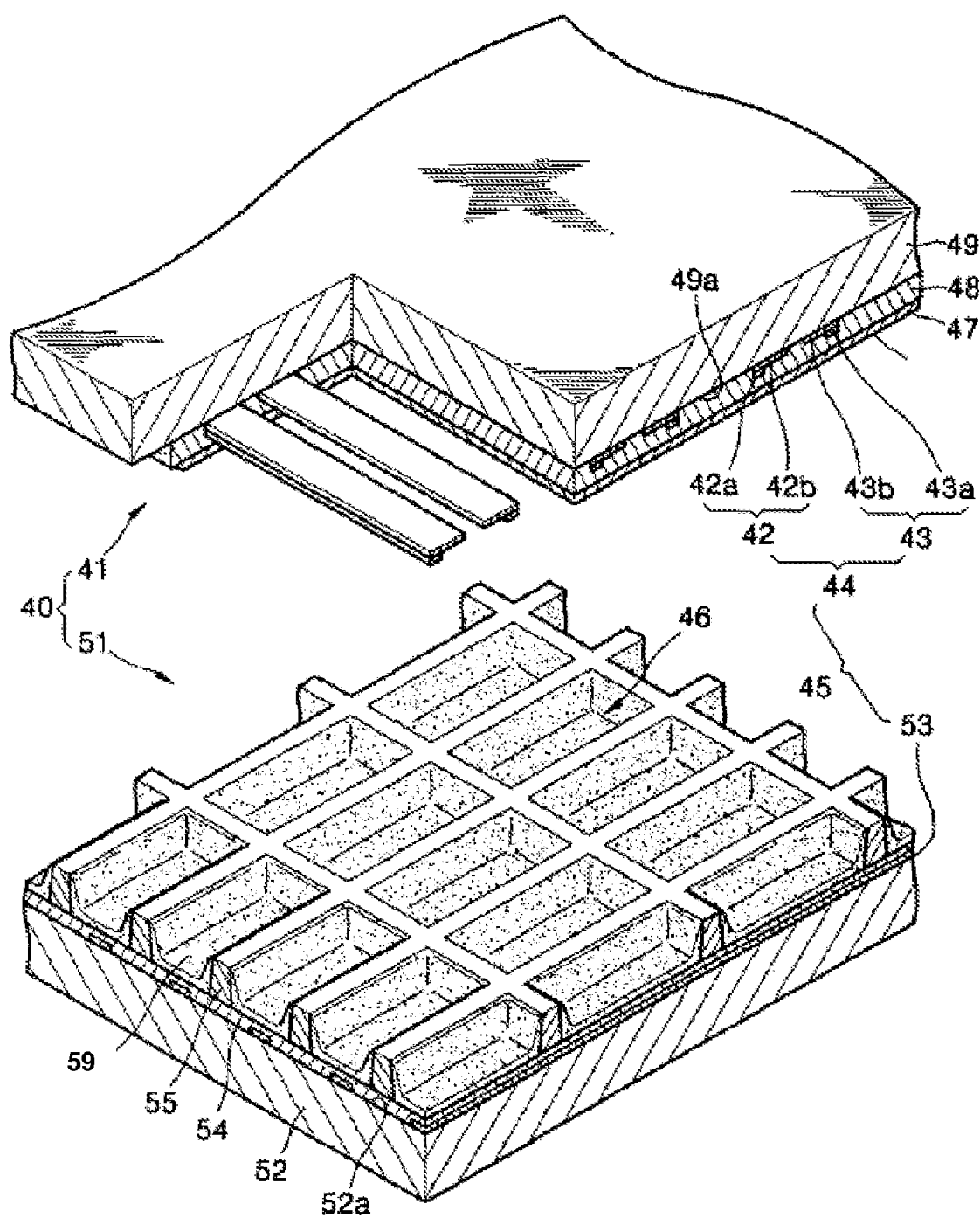
FIG. 2 is a cutaway exploded perspective view showing an example of a PDP that may be applied to the present invention.

Referring to FIG. 2, an example of a PDP 40 that may be used in the plasma display device 100, according to an exemplary embodiment of the present invention, will now be briefly described. The PDP 40 includes a front panel 41 and a rear panel 51. The front panel 41 includes a front substrate 49, sustaining electrode pairs 44 that include Y electrodes 42 and X electrodes 43 formed on a rear surface 49a of the front substrate 49, a front dielectric layer 48 that covers the sustaining electrode pairs 44, and a protective layer 47 that covers the front dielectric layer 48.

The Y electrodes 42 and X electrodes 43 include transparent electrodes 42b and 43b, respectively, which may be formed of indium tin oxide (ITO) to transmit visible light. Generally, the transparent electrodes 42b and 43b are not used alone due to their high resistance. Hence, the Y electrodes 42 and X electrodes 43 may also include bus electrodes 42a and 43a, respectively, which may be formed of a highly conductive metallic material.

In response to a signal applied to the integrated circuit chips 110, the bus Is electrodes 42a and 43a transmit an applied potential to the discharge cells 46 by being coupled to the connecting cables 120 disposed on sides of the PDP 40. At this time, the potential transmitted by the bus electrodes 42a and 43a forms an electric field in the discharge cells 46, thereby accelerating priming particles in the discharge cells 46. The accelerated priming particles collide with a discharge gas to generate a discharge.

However, the potential controlled by the integrated circuit chips 110 may not need to be applied to all sustaining electrode pairs 44. Hence, according to the driving method, sustaining electrode pairs 44 may not be electrically connected to the integrated circuit chips 110.

The rear panel 51 includes a rear substrate 52, address electrodes 53 formed to cross the sustaining electrode pairs 44 and formed on a front surface 52a of the rear substrate 52, and a rear dielectric layer 54 that covers the address electrodes 53.

Here, the address electrodes 53 generate an address discharge that selects discharge cells 46 on which an image is to be displayed when driving the PDP 40. The address electrodes 53 may be coupled to the connecting cables 120 that are disposed on upper and lower sides of the PDP 40, and at this time, as described above, a discharge may be generated by the potential controlled by the integrated circuit chips 110.

The rear panel 51 includes barrier ribs 55 disposed on the rear dielectric layer 54 to define the discharge cells 46. The discharge cells 46 are spaces for displaying an image using visible light generated by the falling energy level of a fluorescent layer 59, which is first excited by ultra violet rays. The barrier ribs 55 also prevent cross talk between discharge cells 46.

The discharge cells 46 are filled with a discharge gas at a pressure (about 0.5 atm) that is lower than the atmospheric pressure. At this time, the PDP 40 is maintained by the barrier ribs 55 disposed between the front panel 41 and the rear panel 51 from a pressure generated by the vacuum state of the discharge gas.

The discharge gas may be one of Ne, He, or Ar that contains approximately 10% Xe or a gas mixture of more than two of these gases. The discharge gas is filled in the PDP 40.

The fluorescent layer 59 disposed in the discharge cells 46 may include red, green, or blue fluorescent materials for displaying a color image, and adjacent discharge cells 46 having red, green, and blue fluorescent materials can form a unit pixel.

The fluorescent layer 59 may be formed by drying and annealing a paste, in which one of the red, green, and blue fluorescent materials, a solvent, and a binder are mixed, and then coating the paste on a front surface of the rear dielectric layer 54 and a portion of side surfaces of the barrier ribs 55 in the discharge cell 46.

For example, a fluorescent material that generates red light may be $(Y,Gd)BO_3:Eu^{3+}$, a fluorescent material that generates green light may be $Zn_2SiO_4:Mn^{2+}$, and a fluorescent material that generates blue light may be $BaMgAl_{10}O_{17}:Eu^{2+}$.

The barrier ribs 55 may be formed such that, after coating a thin film of a barrier rib material (a paste), which includes a glass powder, an organic vehicle, and various fillers, on the rear dielectric layer 54, the coating is patterned and annealed through a predetermined process.

As described above, the PDP 40 is an example of a PDP that may be applied to exemplary embodiments of the present invention. Therefore, the PDP may be formed in various ways. For example, the discharge electrodes may be disposed in barrier ribs made of a dielectric material instead of on the rear surface of the front substrate. Accordingly, the present invention is not limited to the above PDP 40.

Figure 3:
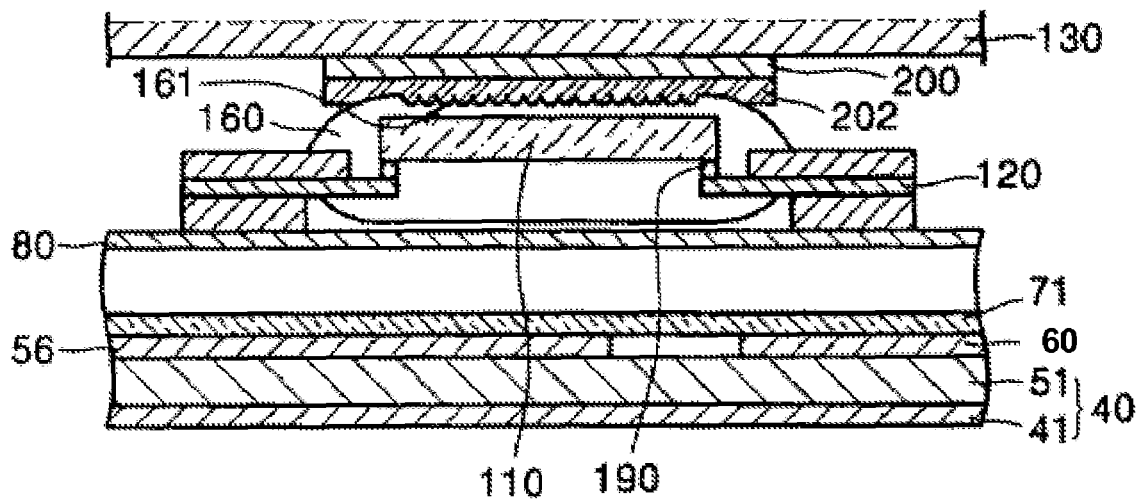
FIG. 3 is a cross-sectional view taken along line III-III of the plasma display device of FIG. 1.

Referring to FIG. 3, the protection film 160 that covers the integrated circuit chips 110 will now be described. The integrated circuit chips 110 include a plurality of terminals (not shown) since they apply a potential to the discharge electrodes 45 in response to external signals.

The integrated circuit chips 110 may be electrically connected to the connecting cables 120 by connecting the connecting cables 120 and the terminals of the integrated circuit chips 110 via bumps 190. The integrated circuit chips 110 are covered by the protection film 160, and a portion of the connecting cables 120 may also be covered by the protection film 160.

A protrusion-recess unit 161 may be formed on a surface of the protection film 160. The protrusion-recess unit 161 may be formed by using a press having a corresponding protrusion-recess portion when forming the protection film 160 or by etching a flat protection film 160. A liquid or a gel phase thermally conductive material 202, such as thermally conductive grease, silicon oil, or a silicon adhesive, may be coated on a surface of the protection film 160. The integrated circuit chips 110 are covered by the cover plate 130. A heat radiation sheet 200 may be interposed between the integrated circuit chips 110 and the cover plate 130.

As described above, heat generated from the integrated circuit chips 110 when driving the PDP 40 radiates to the outside via the cover plate 130. Here, the cover plate 130 has a greater surface area than the integrated circuit chips 1 10. Therefore, heat generated from the integrated circuit chips 110 may be rapidly radiated through the cover plate 130.

The heat radiation sheet 200 prevents heat, which is generated from integrated circuit chips 110, from locally concentrating on the integrated chips 110, and it helps to uniformly radiate the heat outside of the integrated circuit chips 110.

At this time, for effective transferring of heat generated by the integrated circuit chips 110 to the cover plate 130, the integrated circuit chips 110 may be coupled with the heat radiation sheet 200 without a layer of air therebetween by applying an appropriate amount of pressure to the cover plate 130.

If a layer of air remains between the integrated circuit chips 110 and the heat radiation sheet 200 because not enough pressure is applied to the cover plate 130, heat may not be efficiently radiated due to air's low thermal conductivity. This problem may cause the integrated circuit chips 110 to malfunction.

In order to apply enough pressure to the integrated circuit chips 110 by the cover plate 130, the cover plate 130 may be coupled to the chassis 71 or the reinforcing member 80 by screws 131.

At this time, if the surface of the integrated circuit chips 110 is not uniform, a localized force is applied to a portion of the surface of the integrated circuit chips 110 since the heat radiation sheet 200 is typically not very elastic. Therefore, in many cases, the integrated circuit chips 110 are damaged.

The integrated circuit chips 110 are an expensive component since they control a high voltage potential applied to the discharge electrodes 45. Therefore, damaging integrated circuit chips 110 increases manufacturing costs.

To avoid such unnecessary costs, the device is designed so that the pressure may be primarily applied to the protection film 160, when the heat radiation sheet 200 presses the integrated circuit chips 110, by covering the integrated circuit chips 110 with the protection film 160.

In this case, if the surfaces of the heat radiation sheet 200 and the integrated circuit chips 110 are not uniform, pressure concentrated on a portion of the surface of the integrated circuit chips 110 may be exerted on the protection film 160. If the protection film 160 has enough elasticity, a substantially uniform pressure may be applied to the surface of the integrated circuit chips 110 since the elasticity of the protection film 160 offsets the pressure concentrated on a portion of the surface of the protection film 160, thereby preventing damage to the integrated circuit chips 110.

In this case, the protection film 160 may be formed of an elastic material, such as an epoxy resin. The epoxy resin may include a ceramic powder or a ceramic ball having high thermal conductivity to increase the heat radiation efficiency of the protection film 160.

Coating a thermally conductive material 202, such as thermally conductive grease, silicon oil, or a silicon adhesive, on a surface of the protection film 160 may improve heat radiation efficiency. However, in some cases, the thermally conductive material 202 may not sufficiently cover a surface of the protection film 160 because it may be squeezed out when the cover plate 130 is pressed. In this case, the contact between the heat radiation sheet 200 and the protection film 160 is not tight due to the non-uniform coating of the thermally conductive material 202 on the surface of the protection film 160.

To solve this problem, the thermally conductive material 202 may be coated thick enough to fill a space generated between the protection film 160 and the heat radiation sheet 200.

Therefore, as in the plasma display device 100 according to exemplary embodiments of the present invention, a protrusion-recess unit 161 may be formed on a surface of the protection film 160 so that the thermally conductive material 202 may remain in the protrusion-recess unit 161. In this case, heat generated from the integrated circuit chips 110 may be effectively transmitted to the heat radiation sheet 200 through the thermally conductive material 202, thereby effectively radiating heat to the outside.

Figure 4:
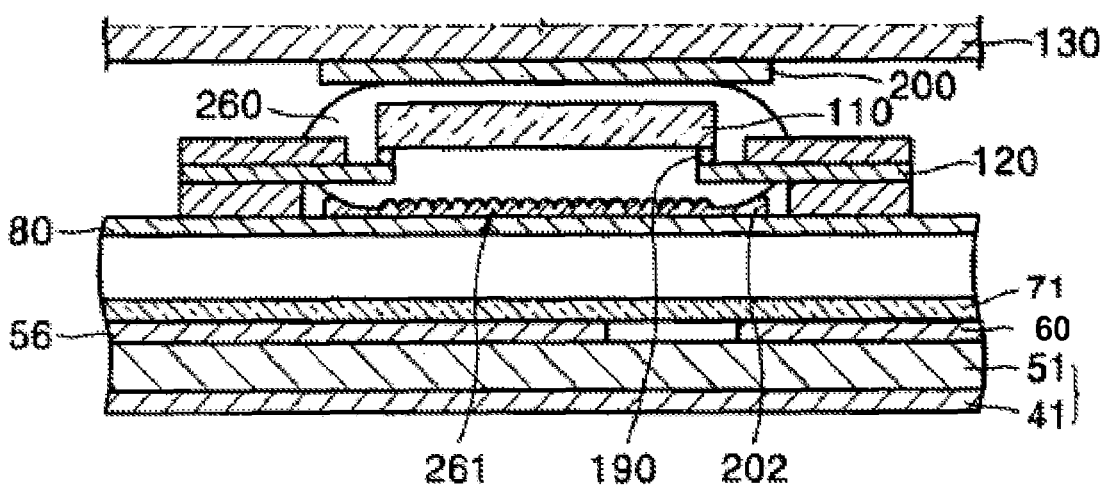
FIG. 4 is a cross-sectional view showing a modified plasma display device of the first embodiment of the present invention.

A first modified version of the first embodiment of the present invention will now be described with reference to FIG. 4, focusing mainly on the differences from the first embodiment. Referring to FIG. 4, a protection film 260 that covers the integrated circuit chips 110 has a protrusion-recess unit 261 on a portion of the protection film 260 facing the reinforcing member 80.

As described above, besides the cover plate 130, the chassis 71 also radiates heat generated from the integrated circuit chips 110 to the outside. Hence, the protrusion-recess unit 261 may be formed on a surface of the protection film 260 that faces the reinforcing member 80 so that the thermally conductive material 202 may be coated substantially uniformly between the reinforcing member 80 and the protection film 260.

A protrusion-recess unit 261 may also be formed on a surface of the protection film 260 that faces the heat radiation sheet 200 in addition to the protrusion-recess unit 261 on the surface of the protection film 260 that faces the reinforcing member 80. In this case, heat generated from the integrated circuit chips 110 may be radiated more effectively.

Figure 5:
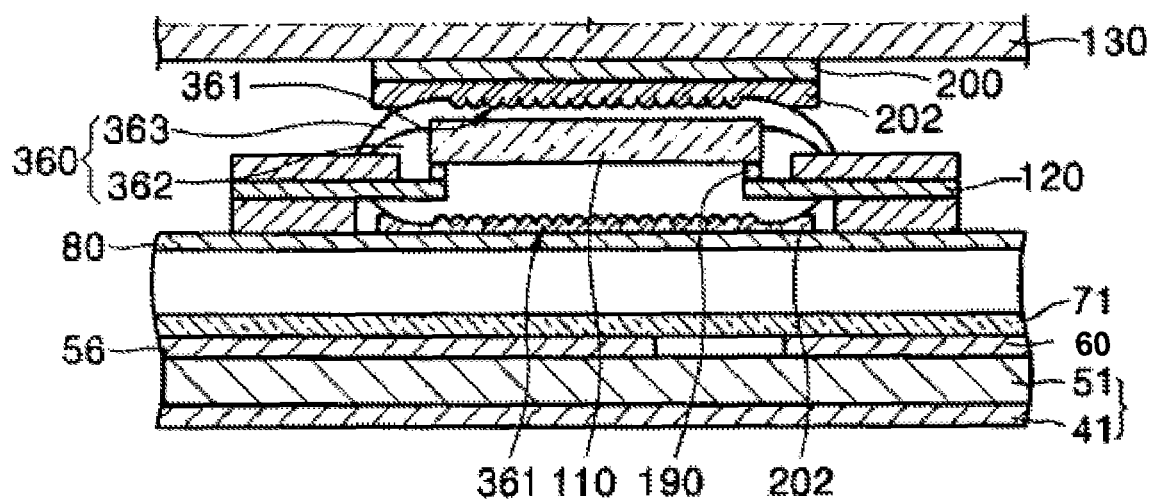
FIG. 5 is a cross-sectional view showing a plasma display device according to a second embodiment of the present invention.

A plasma display device according to a second embodiment will now be described by focusing mainly on the differences from the first embodiment. Referring to FIG. 5, a protection film 360 that covers the integrated circuit chips 110 includes a conductive protection film 363 and a non-conductive protection film 362.

As noted above, radiating heat generated from the integrated circuit chips 110 is important when driving a plasma display device. When the protection film 160 covers the integrated circuit chips 110 as in the first embodiment, epoxy resin may be used as the protection film and a ceramic powder may be further included in the epoxy resin so that the protection film 160 readily transmits heat generated from the integrated circuit chips 110 to the cover plate 130 and the reinforcing member 80, or the chassis 71.

However, to further increase the heat radiation efficiency of the protection film 160, a material having high thermal conductivity, such as aluminum (Al) or magnesium (Mg), may be added to the protection film 160.

In this case, an unnecessary electrical connection to the protection film 160 including Al or Mg should be prevented since Al or Mg are electrically conductive, unlike the ceramic powder.

Accordingly, with these considerations in mind, the protection film that covers the connecting cables 120 can be formed by including the ceramic powder, and the protection film that includes Al or Mg may be coated on an upper surface of the integrated circuit chips 110 where a short circuit will not occur.

Therefore, in the second embodiment of the present invention, the non-conductive protection film 362, which may be formed of epoxy resin that may include a ceramic powder, may cover connection units such as bumps 190 that connect the integrated circuit chips 110 to the connecting cables 120. Furthermore, a conductive protection film 363 that includes Al or Mg may be disposed to cover at least a portion of the non-conductive film 362 and an upper surface of the integrated circuit chips 110.

As described above, protrusion-recess units 361 may be formed on surfaces of the protection film. More specifically, protrusion-recess units 361 may be formed on upper and lower surfaces of the protection film so that a thermally conductive material 202 may be substantially uniformly coated on surfaces of the protection film.

The plasma display device according to the present invention may prevent increased manufacturing costs by preventing damage of integrated circuit chips when installing a cover plate included for efficiently radiating heat generated from the integrated circuit chips.

The present invention provides a plasma display device that may display high quality images by effectively radiating heat generated from the integrated circuit chips.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display device, comprising:
a plasma display panel configured to display images;
an integrated circuit chip configured to control a potential applied to a discharge electrode of the plasma display panel;
a protection film that covers the integrated circuit chip;
a thermally conductive material disposed on at least a portion of a surface of the protection film; and
a cover plate that covers the integrated circuit chip,
wherein the protection film comprises a protrusion-recess unit configured to connect the thermally conductive material to the protection film, and
wherein the protection film has elasticity so that a force applied to the integrated circuit chip is uniform, thereby preventing damage to the integrated circuit chip.

2. The plasma display device of claim 1, wherein the plasma display panel comprises a front substrate and a rear substrate facing the front substrate, discharge electrodes disposed between the front substrate and the rear substrate, and a plurality of discharge cells configured to generate visible light by a discharge generated by potentials applied to the discharge electrodes,
wherein the discharge electrodes comprise sustaining electrode pairs that cross the discharge cells, and address electrodes extending to cross the sustaining electrode pairs.

3. The plasma display device of claim 2, wherein the integrated circuit chip controls a potential applied to the sustaining electrode pairs.

4. The plasma display device of claim 2, wherein the integrated circuit chip controls a potential applied to the address electrodes.

5. The plasma display device of claim 1, wherein the protection film comprises an epoxy resin.

6. The plasma display device of claim 1, further comprising a heat radiation sheet interposed between the integrated circuit chip and the cover plate.

7. The plasma display device of claim 1, wherein the protection film comprises a ceramic powder.

8. The plasma display device of claim 1, further comprising a connecting cable configured to transmit the potential controlled by the integrated circuit chip to the discharge electrode by electrically coupling the integrated circuit chip and the discharge electrode,
wherein the protection film comprises a non-conductive protection film and a conductive protection film, and
wherein the non-conductive protection film covers a connection unit that electrically couples the integrated circuit chip to the connecting cable, and the conductive protection film covers at least a portion of an upper surface of the integrated circuit chip and at least a portion of the non-conductive protection film.

9. The plasma display device of claim 8, wherein the conductive protection film comprises at least one of Al and Mg.

10. The plasma display device of claim 1, further comprising a heat radiation sheet disposed on the thermally conductive material, wherein the protection film is disposed directly on the integrated circuit chip, the thermally conductive material is disposed directly on a surface of the protection film, the heat radiation sheet is disposed directly on the thermally conductive material, and the cover plate is disposed directly on the heat radiation sheet.

11. A plasma display device, comprising:
a plasma display panel configured to display images;
an integrated circuit chip configured to control a potential applied to a discharge electrode of the plasma display panel;
a protection film that covers the integrated circuit chip; and
a thermally conductive material disposed on at least a portion of a surface of the protection film,
wherein the protection film comprises a protrusion-recess unit configured to connect the thermally conductive material to the protection film, and
wherein the protection film has elasticity so that a force applied to the integrated circuit chip is uniform, thereby preventing damage to the integrated circuit chip.

12. The plasma display device of claim 11, further comprising:
a chassis base coupled to a rear surface of the plasma display panel;
a reinforcing member coupled to a rear surface of the chassis base; and
a cover plate that covers the integrated circuit chip,
wherein the integrated circuit chip is interposed between the cover plate and the reinforcing member.

13. The plasma display device of claim 12, wherein a first protrusion-recess unit is formed on a surface of the protection film facing the reinforcing member, and a second protrusion-recess unit is formed on a surface of the protection film facing the cover plate.

14. The plasma display device of claim 11, further comprising a connecting cable configured to transmit the potential controlled by the integrated circuit chip to the discharge electrode by electrically coupling the integrated circuit chip and the discharge electrode,
wherein the protection film comprises a non-conductive protection film and a conductive protection film, and
wherein the non-conductive protection film covers a connection unit that electrically couples the integrated circuit chip to the connecting cable, and the conductive protection film covers at least a portion of an upper surface of the integrated circuit chip and at least a portion of the non-conductive protection film.

15. The plasma display device of claim 14, wherein a first protrusion-recess unit is formed on a surface of the conductive protection film, and a second protrusion-recess unit is formed on a surface of the non-conductive protection film.

16. The plasma display device of claim 11, wherein the protection film comprises an epoxy resin.

17. The plasma display device of claim 16, wherein the epoxy resin comprises a ceramic material.

18. The plasma display device of claim 17, wherein the ceramic material is a ceramic powder or a ceramic ball.

* * * * *